United States Patent
Akabori et al.

(10) Patent No.: US 9,582,468 B2
(45) Date of Patent: Feb. 28, 2017

(54) CAPACITY ESTIMATING APPARATUS FOR SECONDARY BATTERY

(75) Inventors: Kouichi Akabori, Yokohama (JP); Takashi Iimori, Tokyo (JP); Tsutomu Soga, Machida (JP)

(73) Assignee: NISSAN MOTOR CO., LTD., Yokohama-shi (JP)

( * ) Notice: Subject to any disclaimer, the term of this patent is extended or adjusted under 35 U.S.C. 154(b) by 1118 days.

(21) Appl. No.: 13/702,826

(22) PCT Filed: Jun. 8, 2011

(86) PCT No.: PCT/JP2011/003246
§ 371 (c)(1),
(2), (4) Date: Dec. 7, 2012

(87) PCT Pub. No.: WO2011/155201
PCT Pub. Date: Dec. 20, 2011

(65) Prior Publication Data
US 2013/0090871 A1   Apr. 11, 2013

(30) Foreign Application Priority Data
Jun. 8, 2010  (JP) ................................. 2010-130666

(51) Int. Cl.
  *G01R 31/36*  (2006.01)
  *G06F 17/00*  (2006.01)
(52) U.S. Cl.
  CPC ........... *G06F 17/00* (2013.01); *G01R 31/361* (2013.01)
(58) Field of Classification Search
  None
  See application file for complete search history.

(56) References Cited

U.S. PATENT DOCUMENTS

| 5,691,078 A | 11/1997 | Kozaki et al. |
| 8,258,753 B2 * | 9/2012 | Akabori ............. G01R 31/3606 320/132 |

(Continued)

FOREIGN PATENT DOCUMENTS

| JP | 2008-145349 A | 6/2008 |
| JP | 2009-216403 A | 9/2009 |

(Continued)

OTHER PUBLICATIONS

Korean Office Action. Dec. 13, 2013. 3 pages.

*Primary Examiner* — Aditya Bhat
(74) *Attorney, Agent, or Firm* — Foley & Lardner LLP

(57) ABSTRACT

A capacity estimating apparatus for a secondary battery includes a current-detecting section configured to detect a value of current flowing in the secondary battery; a voltage-detecting section configured to detect a voltage value of the secondary battery; a first estimating section configured to calculate a first estimate value of a remaining capacity of the secondary battery on the basis of an accumulated value of the current values detected by the current-detecting section; and a second estimating section configured to calculate a second estimate value of the remaining capacity of the secondary battery on the basis of the voltage value detected by the voltage-detecting section. The first estimating section is configured to calculate a difference between the first estimate value and the second estimate value, and to correct the first estimate value by correcting the accumulated value so as to gradually reduce the difference.

17 Claims, 6 Drawing Sheets

(56) References Cited

U.S. PATENT DOCUMENTS

2008/0150491 A1* 6/2008 Bergveld ............ G01R 31/361
    320/139
2009/0254290 A1 10/2009 Kim et al.
2010/0289454 A1 11/2010 Akabori et al.

FOREIGN PATENT DOCUMENTS

| JP | 2009-250970 A | 10/2009 |
| JP | 2010-019595 A | 1/2010 |
| KR | 10-0386053 B1 | 8/2008 |

* cited by examiner

CAPACITY ESTIMATING APPARATUS FOR SECONDARY BATTERY

TECHNICAL FIELD

The present invention relates to a capacity estimating apparatus for a secondary battery.

BACKGROUND ART

As a method of estimating a remaining capacity (charging capacity) of a secondary battery, there are a method in which the remaining capacity is estimated by accumulating (integrating) electric-current values and a method in which the remaining capacity is estimated from an open-circuit voltage by using a relation between the open-circuit voltage and the remaining capacity. The former is called a current-accumulation method, and the latter is called an open-circuit voltage method. Each of these two methods has merit and demerit. The former has a problem with a detection accuracy of current value and an accumulation accuracy of current values. The latter has a problem with a detection accuracy during a charging or discharging of the secondary battery. Hence, in order to enhance an estimation accuracy of the remaining capacity, more accurate one is selected from the these two estimating method in accordance with a state of the secondary battery.

Japanese Patent Application Publication No. 2009-216403 (Patent Document 1) corresponding to US Patent Application Publication No. 2010/0289454 discloses a previously-proposed remaining-capacity estimating apparatus. In this technique, a change of estimate value of the remaining capacity which is caused by the selection between the current-accumulation method and the open-circuit voltage method is restricted when the estimate value has a tendency to decrease during a charging state of the secondary battery or when the estimate value has a tendency to increase during a discharging state of the secondary battery. Thereby, a strangeness feeling of driver that is caused due to a phenomenon in which the estimate value decreases despite during the charging state or a phenomenon in which the estimate value increases despite during the discharging state can be relieved.

CITATION LIST

Patent Literature

PTL 1: Japanese Patent Application Publication No. 2009-216403

SUMMARY OF INVENTION

However, in the above previously-proposed technique, when the change of the estimate value is restricted, the estimate value becomes a constant value (i.e., a fixed value) despite during the charging state or during the discharging state. Hence, the driver has a strangeness feeling that is caused due to a phenomenon in which the estimate value does not increase during the charging state or a phenomenon in which the estimate value does not decrease during the discharging state.

It is an object of the present invention to provide a capacity estimating apparatus for a secondary battery, devised to relieve the strangeness feeling of driver due to a behavior of the estimate value.

According to one aspect of the present invention, there is provided a capacity estimating apparatus for a secondary battery, comprising: a current-detecting section configured to detect a value of current flowing in the secondary battery; a voltage-detecting section configured to detect a voltage value of the secondary battery; a first estimating section configured to calculate a first estimate value of a remaining capacity of the secondary battery on the basis of an accumulated value of the current values detected by the current-detecting section; and a second estimating section configured to calculate a second estimate value of the remaining capacity of the secondary battery on the basis of the voltage value detected by the voltage-detecting section, wherein the first estimating section is configured to calculate a difference between the first estimate value and the second estimate value, and to correct the first estimate value by correcting the accumulated value so as to gradually reduce the difference.

According to another aspect of the present invention, there is provided a capacity estimating apparatus for a secondary battery, comprising: a current-detecting section configured to detect a value of current flowing in the secondary battery; a voltage-detecting section configured to detect a voltage value of the secondary battery; a first estimating section configured to calculate a first estimate value of a remaining capacity of the secondary battery on the basis of an accumulated value of the current values detected by the current-detecting section; a second estimating section configured to calculate a second estimate value of the remaining capacity of the secondary battery on the basis of the voltage value detected by the voltage-detecting section; and a correcting section configured to calculate a difference between the first estimate value and the second estimate value, and to correct the first estimate value to gradually reduce the difference.

DESCRIPTION OF EMBODIMENTS

Figure 1:
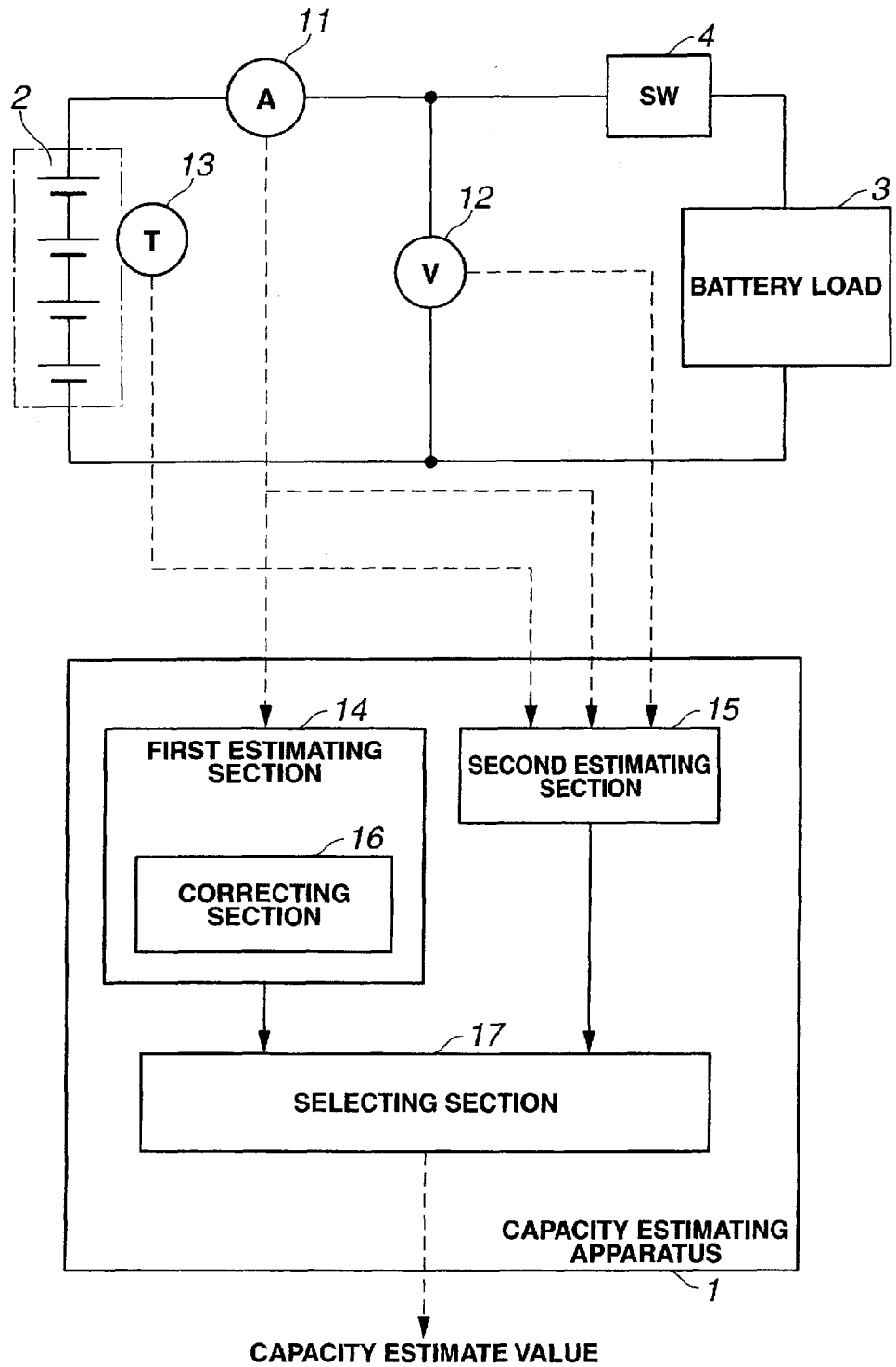
FIG. 1 is a block diagram showing a secondary-battery system to which an embodiment according to the present invention has been applied.

FIG. 1 is a block diagram showing one example of a secondary-battery system to which a capacity estimating apparatus according to the present invention has been applied. In this embodiment, electric power is supplied from a secondary battery 2 through a switch 4 to a battery load 3. Thereby, the battery load 3 is driven.

As the secondary battery 2, a battery pack (assembled battery) in which a plurality of electric cells are connected in series with and/or in parallel with each other can be used. Alternatively, the secondary battery 2 may be constituted by a single electric cell. The battery load 3 is, for example, an electric motor for driving an electric vehicle, an auxiliary equipment of vehicle, or a battery charger of vehicle. In the following secondary-battery system, the battery load 3 is a motor/generator for driving an electric vehicle and is configured to perform power running and power regeneration.

The switch 4 is, for example, a start switch in the case that the battery load 3 is the electric motor for driving the electric vehicle. The start switch in this case corresponds to an ignition switch of a vehicle having internal combustion engine as its drive source.

In this embodiment, the capacity estimating apparatus 1 includes a current sensor 11, a voltage sensor 12 and a temperature sensor 13 in order to detect various characteristic values of the secondary battery 2.

The current sensor 11 senses a value of current flowing in a circuit (electric wire) connecting the secondary battery 2 with the battery load 3, in order to detect a discharge current value or a charging current value of the secondary battery 2. Then, the current sensor 11 outputs this detection signal to an after-mentioned first estimating section 14 and an after-mentioned second estimating section 15. When the secondary battery 2 supplies electric power to the battery load 3 (hereinafter also referred to as, during discharging), the current sensor 11 senses a current value having negative sign (i.e., minus value). On the other hand, when the battery load 3 supplies electric power to the secondary battery 2 (hereinafter also referred to as, during charging), the current sensor 11 senses a current value having positive sign (i.e., plus value).

As shown in FIG. 1, the voltage sensor 12 detects a voltage given between both circuits (electric wires) each connecting the secondary battery 2 with the battery load 3, in order to detect an open-circuit voltage of the secondary battery 2. Then, this detection signal is received or read by the second estimating section 15.

The temperature sensor 13 detects, e.g., a surface temperature of a casing of the secondary battery 2, in order to detect a temperature of the secondary battery 2 when the voltage sensor 12 detects the open-circuit voltage. This detection signal is received or read by the second estimating section 15.

The capacity estimating apparatus 1 further includes the first estimating section 14, the second estimating section 15, a correcting section 16, and a selecting section 17. These respective sections 14 to 17 can be constructed and realized by a microcomputer including arithmetic devices such as CPU and MPU and storage devices such as ROM and RAM. These sections 14 to 17 are distinguished from one another for convenience sake in order to show respective functions of this embodiment. That is, whole of the sections 14 to 17 can be realized by the above-mentioned one or more arithmetic devices and one or more storage devices from a viewpoint of hardware. Moreover, from a viewpoint of software, whole of the sections 14 to 17 can be realized by one or more programs.

The first estimating section 14 includes an accumulating circuit for accumulating or integrating current values obtained from a time of accumulation start. The first estimating section 14 reads the current-value detection signal of the current sensor 11, for example, with a predetermined period equal to 0.01 seconds. That is, the first estimating section 14 reads the current-value detection signal at 0.01-seconds interval. Then, the accumulating circuit accumulates the read current values obtained from the time of accumulation start. Then, the first estimating section 14 sets this current-accumulated value as a first estimate value $SOC_I$, and outputs the first estimate value $SOC_I$ to the correcting section 16. Although SOC (State Of Charge: unit %) is used in the explanations of this embodiment, a battery capacity (unit: Ah) corresponding to SOC can also be used in the embodiment according to the present invention.

[Math. 1]

The second estimating section 15 reads the current-value detection signal of the current sensor 11, the voltage-value detection signal of the voltage sensor 12 and the temperature detection signal of the temperature sensor 13, for example, with a predetermined period equal to 0.01 seconds. The second estimating section 15 calculates the open-circuit voltage from the current value of the current sensor 11, the voltage value of the voltage sensor 12 and an internal resistance of the secondary battery 2 which is estimated from the temperature of the temperature sensor 13, by using the following formula [1].

Open-circuit voltage=Voltage value±Current value× Internal resistance    [1]

Figure 4:
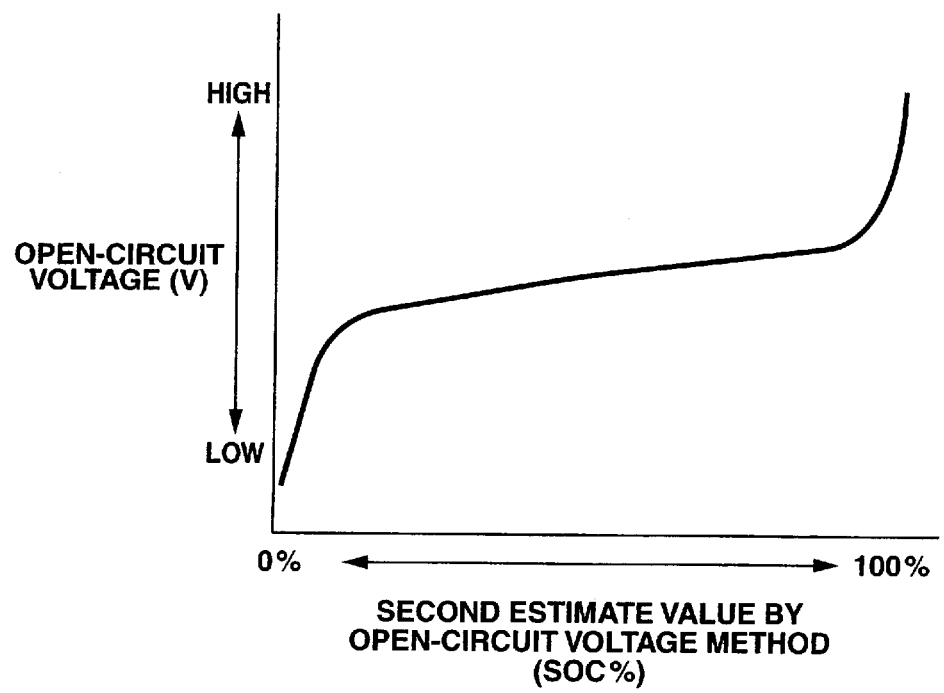
FIG. 4 is a control map showing a relation between an open-circuit voltage value and a second estimate value, which is used at steps ST3 and ST4 of FIG. 2.
Figure 5:
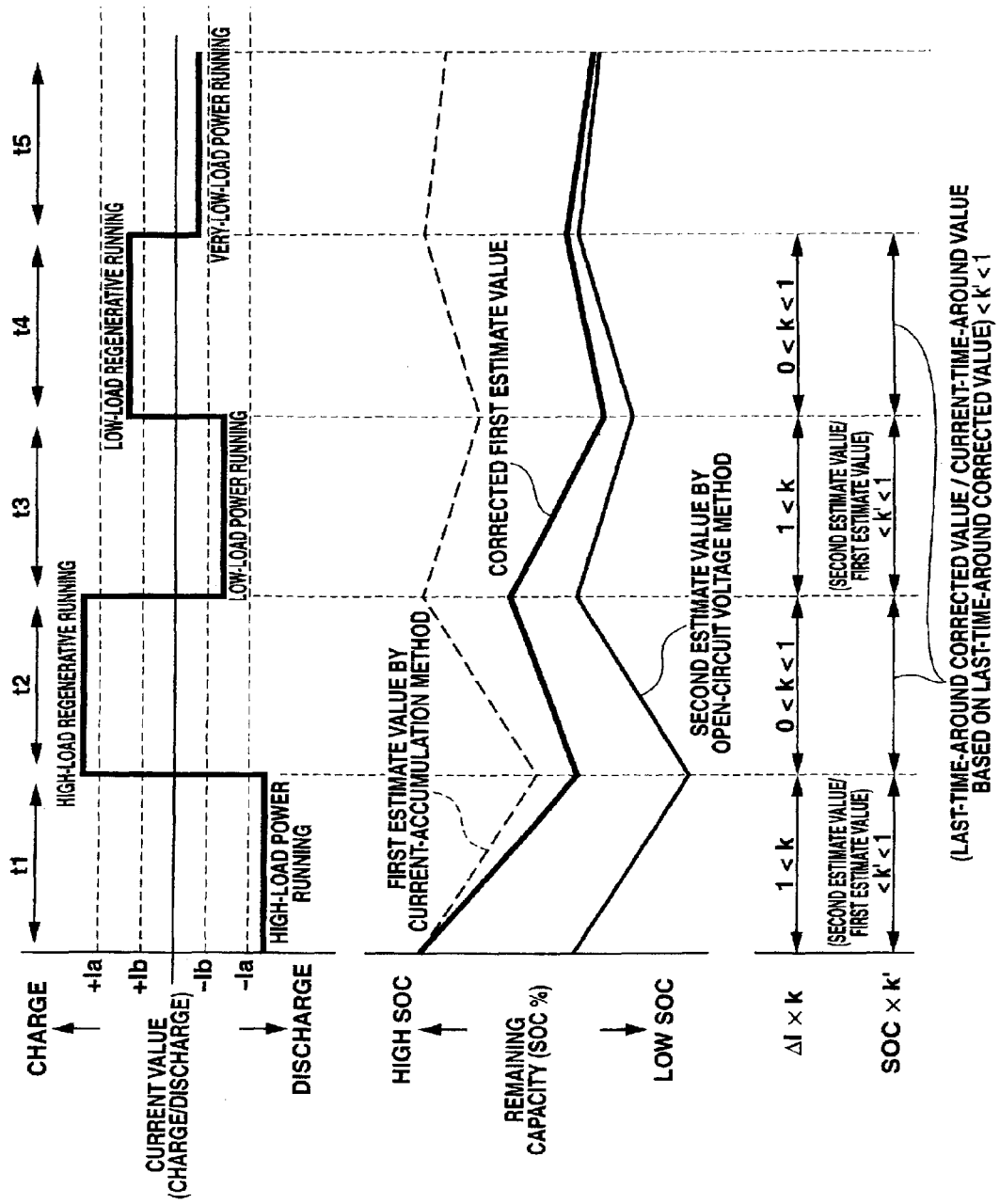
FIG. 5 is a time chart showing a charging-and-discharging pattern of the secondary-battery system of FIG. 1 and estimate values by the capacity estimating apparatus, in another situation.

The sign "±" of the formula [1] means that a voltage rise caused by the internal resistance is subtracted from the voltage value of voltage sensor 12 during charging, and on the other hand, a voltage drop caused by the internal resistance is added to the voltage value of voltage sensor 12 during discharge. Then, the second estimating section 15 calculates a second estimate value $SOC_{OCV}$, by using a previously-prepared control map between the open-circuit voltage and the second estimate value $SOC_{OCV}$ (see FIG. 4). Then, the second estimating section 15 outputs the calculated second estimate value $SOC_{OCV}$ to the selecting section 17. The control map between the open-circuit voltage of the secondary battery 2 and the second estimate value $SOC_{OCV}$ as shown in FIG. 4 has been stored in the second estimating section 15 in advance. Also, a map between the temperature and the internal resistance of the secondary battery 2 has been stored in the second estimating section 15 in advance.

The correcting section 16 corrects the (currently-calculated) first estimate value $SOC_I$ at predetermined timings, and then, outputs the corrected first estimate value $SOC_I$ to the selecting section 17. When the correcting section 16 does not correct the first estimate value $SOC_I$, the correcting section 16 outputs the (currently-calculated) first estimate value $SOC_I$ directly to the selecting section 17. The correcting section 16 keeps a newest (current) value of the first estimate value $SOC_I$. A correction method and correction timings by the correcting section 16 will be explained below.

The selecting section 17 selects one of the first estimate value $SOC_I$ inputted through the correcting section 16 from the first estimating section 14 and the second estimate value $SOC_{OCV}$ inputted from the second estimating section 15. Then, the selecting section 17 outputs the selected one of the first estimate value $SOC_I$ and the second estimate value $SOC_{OCV}$, to an external equipment as a capacity (=remaining capacity, i.e., a finally-determined state of charge) of the secondary battery 2. The external equipment is, for example, a remaining-capacity meter for the secondary battery 2 which is provided at an instrument panel or the like of the electric vehicle. Alternatively, the external equipment may be a control system of controlling an output of the motor/ generator for driving electric vehicle. However, the external equipment according to this embodiment is not limited to these.

The selecting section 17 selects between the first estimate value $SOC_I$ and the second estimate value $SOC_{OCV}$ in accordance with a configuration of the secondary-battery system and various conditions. For example, in the case of the secondary-battery system using the motor/generator for driving the electric vehicle as the battery load 3, the voltage value which is detected by the voltage sensor 12 is unstable so that an estimation accuracy of the second estimate value $SOC_{OCV}$ is reduced when a discharging amount or a charging amount (per unit time) of the secondary battery 2 is large, such as at the time of high-load running. On the other hand, when the secondary battery 2 has no load, such as when the switch 4 has been turned off; the discharging amount or the charging amount (per unit time) of the secondary battery 2 is equal to 0, so that the voltage value detected by the voltage sensor 12 becomes equal to the second estimate value $SOC_{OCV}$. Hence, at this time, the estimation accuracy of the second estimate value $SOC_{OCV}$ is improved.

Therefore, as one example according to this embodiment, the selecting section 17 selects the first estimate value $SOC_I$ from the first estimate value $SOC_I$ and the second estimate value $SOC_{OCV}$ when the secondary battery 2 is discharging electric power (i.e., during discharging) or is charging electric power (i.e., during charging). On the other hand, the selecting section 17 selects the second estimate value $SOC_{OCV}$ from the first estimate value $SOC_I$ and the second estimate value $SOC_{OCV}$ when the secondary battery 2 is in no-load state (i.e., when the secondary battery 2 is neither during discharging nor during charging). However, the capacity estimating apparatus 1 according to the present invention is not limited by a selecting method by which the selecting section 17 selects between the first estimate value $SOC_I$ and the second estimate value $SOC_{OCV}$.

Control procedures in this embodiment will now be explained referring to FIGS. 2 to 6. As mentioned above, when the secondary battery 2 is during discharge or during charging, the first estimate value $SOC_I$ calculated by the first estimating section 14 by the current-accumulation method is selected by the selecting section 17 to be used for various controls in the external equipment. However, because the first estimate value $SOC_I$ is calculated also during a vehicle running repeating the discharge and the charging at random, an error based on a difference in the discharging amount or in the charging amount is gradually stored in the first estimate value $SOC_I$.

Therefore, from a viewpoint of accuracy of the remaining capacity, it is preferable that when the switch 4 is turned on after the switch 4 was turned off in response to a finish of the vehicle running, the currently-indicated first estimate value $SOC_I$ is reset to become equal to a value of the second estimate value $SOC_{OCV}$ calculated under no load condition immediately after the switch 4 is turned on.

However, if the first estimate value $SOC_I$ is changed to the value of the second estimate value $SOC_{OCV}$ at one time (rapidly), there is a risk that a driver receives a strangeness feeling. That is, as a difference between the first estimate value $SOC_I$ and the second estimate value $SOC_{OCV}$ becomes larger, the driver receives the strangeness feeling more strongly. Hence, from a viewpoint of strangeness feeling of driver, it is undesirable that the first estimate value $SOC_I$ is reset to become equal to the value of the second estimate value $SOC_{OCV}$ at one time. Moreover, even in the case that the estimate value is reset during discharge or during charging as the above-mentioned Patent Document 1, the driver receives strangeness feeling when the estimate value is fixed during discharge or when the estimate value is greatly varied during charging. Hence, the case as the above-mentioned Patent Document 1 is also not undesirable.

Therefore, the capacity estimating apparatus 1 in this embodiment is focused on a point that the first estimate value $SOC_I$ which is obtained by the current-accumulation method gradually stores (contains) its error due to the detection error of the current sensor 11. Moreover, the capacity estimating apparatus 1 in this embodiment is focused on a point that a rate of the detection error of the current sensor 11 which is used for the current-accumulation method is varied (increased and decreased) according to a magnitude of the detected current value. Accordingly, the following control flow is performed in this embodiment.

At first, at step ST1, the controller judges whether or not the charge and discharge of the secondary-battery system has been permitted. In other words, it is judged whether or not the switch 4 has been turned on. When the switch 4 is in an OFF state, this step ST1 is repeated until the switch 4 is turned on. When the switch 4 has been turned on, the program proceeds to step ST2.

At step ST2, the controller detects a time interval between a time point when the switch 4 was turned off (i.e., a time point when both of the charging and the discharging of the secondary battery 2 were prohibited) and a time point when the switch 4 was turned on, i.e., calculates this-time-around inactive time of the switch 4, by using a timer or the like (not shown). If this time interval is longer than or equal to a predetermined time interval (for example, one week), namely if YES at step ST2; the program proceeds to step ST3. In the case that the secondary battery 2 has been left as it is for a long time under no load condition, a self-discharge amount becomes too large to ignore. Thereby, in this case, both of the first estimate value $SOC_I$ and the second estimate value $SOC_{OCV}$ which were calculated before the switch 4 was turned off have deviated from a current true value of SOC (i.e., actual State Of Charge) of the secondary battery 2.

Therefore, at step ST3, the second estimating section 15 calculates the second estimate value $SOC_{OCV}$, and the first estimate value $SOC_I$ is corrected (set) to become equal to the calculated value of the second estimate value $SOC_{OCV}$. Then, the processing of step ST3 ends. Although the first estimate value $SOC_I$ becomes rapidly equal to the calculated value of the second estimate value $SOC_{OCV}$ at step ST3, the driver does not have any strangeness feeling because the first estimate value $SOC_I$ is varied after the secondary battery 2 has been left for a long time (i.e., after the switch 4 has been in OFF state for a long time).

[Math. 2]

If the controller determines that the above-mentioned time interval is shorter than the predetermined time interval (for example, one week) at step ST2, the program proceeds to step ST4. At step ST4, the controller calculates the open-circuit voltage (=Detected voltage value±Detected current value×Internal resistance) on the basis of detection signals of the current sensor 11, the voltage sensor 12 and the temperature sensor 13. Then, the controller calculates the second estimate value $SOC_{OCV}$ from the calculated open-circuit voltage and the control map shown in FIG. 4.

[Math. 3]

At step ST5, the controller calculates a difference $\Delta SOC$ (=$SOC_{OCV}$–$SOC_I$) between the value of second estimate value $SOC_{OCV}$ calculated at step ST4 and the value of first estimate value $SOC_I$ which was calculated when the switch 4 was turned off last time and which is being kept in the correcting section 16. This difference $\Delta SOC$ is calculated as a positive value or a negative value in accordance with a magnitude relation between the first estimate value $SOC_I$ and the second estimate value $SOC_{OCV}$. Alternatively, an absolute value $|\Delta SOC|$ of the difference between the first estimate value $SOC_I$ and the second estimate value $SOC_{OCV}$ may be calculated.

[Math. 4]

At step ST6, the controller calculates an absolute value of the difference $\Delta SOC$ calculated at step ST5, and judges whether or not the absolute value of the difference $\Delta SOC$ is larger than or equal to a predetermined threshold value $SOC_k$. It is preferable that this predetermined threshold value $SOC_k$ is set at a level that can provide a permissible estimate accuracy for the external equipment whichever is selected between the first estimate value $SOC_I$ and the second estimate value $SOC_{OCV}$. If the absolute value of the difference $\Delta SOC$ is smaller than the predetermined threshold value $SOC_k$, namely if NO at step ST6; the program proceeds to step ST7. If the absolute value of the difference $\Delta SOC$ is larger than or equal to the predetermined threshold value $SOC_k$, namely if YES at step ST6; the program proceeds to step ST8.

[Math. 5]

At step ST7, since the absolute value of the difference $\Delta SOC$ is smaller than the predetermined threshold value $SOC_k$, the first estimate value $SOC_I$ secures a sufficient accuracy and is unnecessary to be corrected. Hence, the value of first estimate value $SOC_I$ which was calculated when the switch 4 was turned off last time and which is being kept in the correcting section 16 is set (i.e., is maintained) as it is as the first estimate value $SOC_I$.

[Math. 6]

Contrarily, at step ST8, since the absolute value of the difference $\Delta SOC$ is larger than or equal to the predetermined threshold value $SOC_k$, an accuracy of the first estimate value $SOC_I$ relative to the true value of the remaining capacity is low. Hence, the first estimate value $SOC_I$ needs to be corrected. This correction for the first estimate value $SOC_I$ is carried out during the discharging of the secondary battery 2 and the charging of the secondary battery 2 which are started after the switch 4 is turned on at step ST1. At that time, a correction amount of this correction for the first estimate value $SOC_I$ is set according to a magnitude of current flowing in the secondary battery 2 during the discharging or the charging. As mentioned above, the rate of the detection error of the current sensor 11 becomes larger as the detected current value (i.e., flowing current value) becomes smaller, because of a gain of the current sensor 11.

[Math. 7]

Therefore, the correction amount of the first estimate value $SOC_I$ is set at a smaller value as the current value becomes larger, under an identical charging/discharging state (i.e., the charging state or discharging state) of the secondary battery 2 and under an identical magnitude relation between the first estimate value $SOC_I$ and the second estimate value $SOC_{OCV}$ (i.e., $SOC_I > SOC_{OCV}$ or $SOC_I < SOC_{OCV}$). In other words, the correction amount of the first estimate value $SOC_I$ is set at a larger value as the current value becomes smaller as compared under same conditions of the charging/discharging state and the magnitude relation.

[Math. 8]

Figure 3:
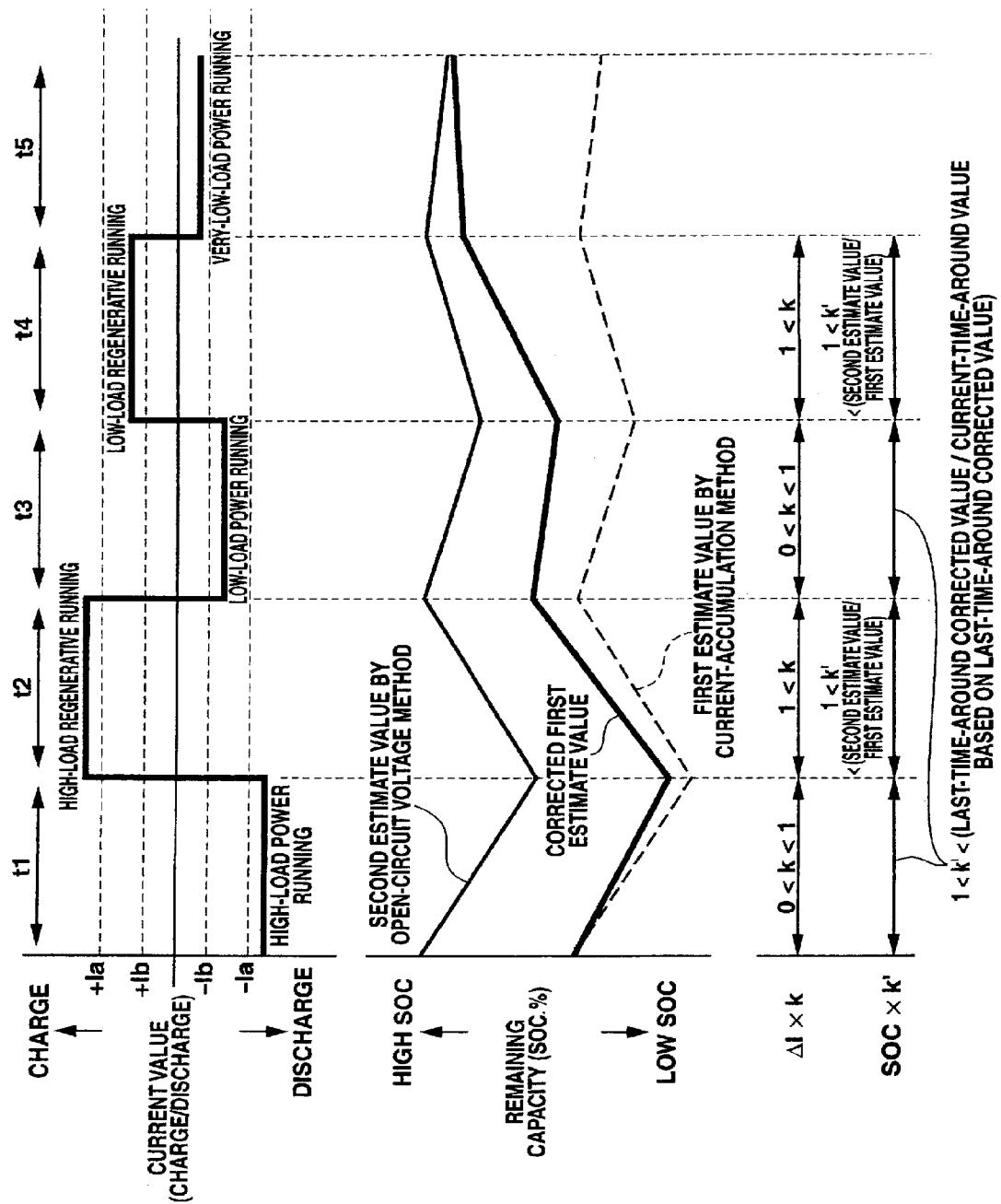
FIG. 3 is a time chart showing a charging-and-discharging pattern of the secondary-battery system of FIG. 1 and estimate values by the capacity estimating apparatus.

In this embodiment, as shown in FIG. 3, threshold values Ia, Ib, −Ia, and −Ib are provided for judging or recognizing a magnitude level of the current value detected by the current sensor 11. The threshold values Ia and Ib are provided for the charging, and the threshold values −Ia and −Ib are provided for the discharging. The four threshold values Ia, Ib, −Ia, and −Ib satisfy a relation of Ia>Ib>−Ib>−Ia. The threshold value +Ia is a limit value above which the detection error of the current sensor 11 does not affect the current-accumulated value very much. In the same manner, the threshold value −Ia is a limit value below which the detection error of the current sensor 11 does not affect the current-accumulated value very much. Moreover, the threshold value +Ib is a limit value below which it cannot be judged whether the secondary battery 2 is during the charging or during the discharging from the detected current value due to the detection error of the current sensor 11. In the same manner, the threshold value −Ib is a limit value above which it cannot be judged whether the secondary battery 2 is during the charging or during the discharging from the detected current value due to the detection error of the current sensor 11.

Figure 2:
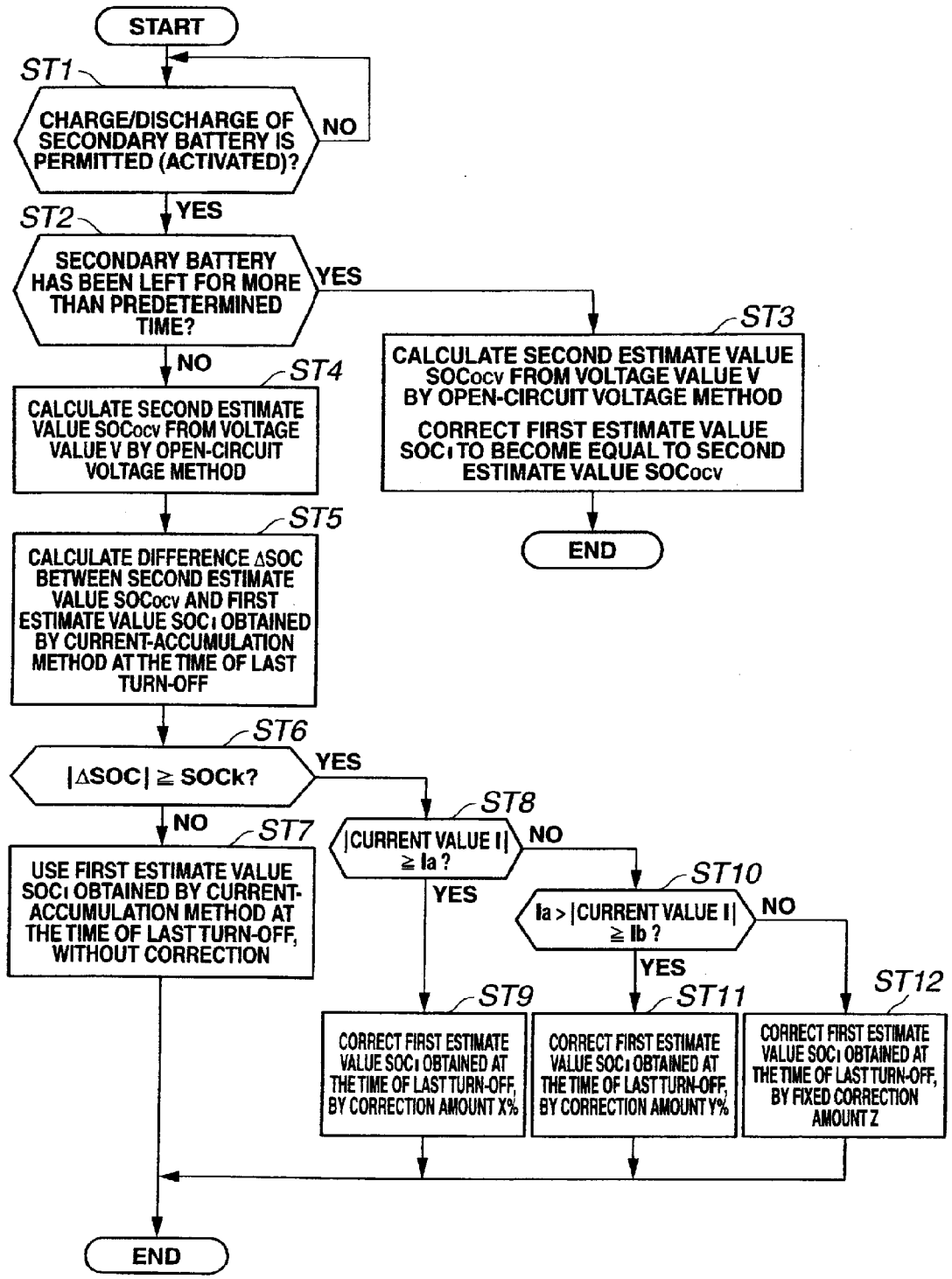
FIG. 2 is a flowchart showing a control flow of a capacity estimating apparatus of FIG. 1.

At step ST8 of FIG. 2, the controller judges whether or not an absolute value of the current value I detected by the current sensor 11 is larger than or equal to the threshold value Ia. If the absolute value of the current value I is larger than or equal to the threshold value Ia, namely if YES at step ST8; the program proceeds to step ST9. At step ST9, the correction amount of the first estimate value $SOC_I$ is set at X %. If the absolute value of the current value I is smaller than the threshold value Ia, namely if NO at step ST8; the program proceeds to step ST10. At step ST10, the controller judges whether or not the absolute value of the current value I is larger than or equal to the threshold value Ib. If the absolute value of the current value I is larger than or equal to the threshold value Ib, namely if YES at step ST10; the program proceeds to step ST11. At step ST11, the correction amount of the first estimate value $SOC_I$ is set at Y %. If the absolute value of the current value I is smaller than the threshold value Ib, namely if NO at step ST10; the program proceeds to step ST12. At step ST12, the correction amount of the first estimate value $SOC_I$ is set at a predetermined fixed value Z.

The correction processing of steps ST9, ST11 and ST12 will now be explained more specifically referring to FIG. 3. In an example shown in FIG. 3; the switch 4 of the secondary-battery system is turned on, and then, the program proceeds from the judgment of step ST6 to step ST8 in FIG. 2, and it is determined that the first estimate value is smaller than the second estimate value ($SOC_I < SOC_{OCV}$). Moreover, in this example, the vehicle performs a high-load power running (time period t1), a high-load regenerative running (time period t2), a low-load power running (time period t3), a low-load regenerative running (time period t4) and a very-low-load power running (time period t5) in this order. In this case, a variation of the current value is shown by an upper graph of FIG. 3. That is, the current value during discharging is smaller than the threshold value −Ia for the time period t1 because the vehicle climbs a steep hill. Next, the current value during charging (i.e., during a regeneration of the motor/generator for driving the vehicle) is larger than the threshold value +Ia for the time period t2 because the vehicle descends a steep hill. Next, the current value during discharging becomes larger than the threshold value −Ia and smaller than the threshold value −Ib for the time period t3 because the vehicle runs on a flat road at a low speed. Next, the current value during charging becomes larger than the threshold value +Ib and smaller than the threshold value +Ia for the time period t4 because the vehicle descends a gentle hill. Next, the current value during discharging becomes larger than the threshold value −Ib for the time period t5 because the vehicle runs at a very low speed just before the vehicle is stopped. Such an example will now be used for explaining this embodiment according to the present invention.

On the assumption that the first estimate value $SOC_I$ was selected by the selecting section 17 as the estimate value of the remaining capacity when the switch 4 was turned off last time, the remaining-capacity meter of the electric vehicle indicates a remaining amount (remaining capacity) according to the first estimate value $SOC_I$ when the switch 4 is currently turned on. Hence, this indication needs to be brought closer to the second estimate value $SOC_{OCV}$ which is near the true value of the remaining capacity (true SOC), without giving the strangeness feeling to the driver.

A lower graph of FIG. 3 is a time chart showing variations of the first estimate value $SOC_I$ and the second estimate value $SOC_{OCV}$ in the running history of the above-mentioned example. The second estimate values $SOC_{OCV}$ shown in FIG. 3 are calculated by the second estimating section 15. The first estimate values $SOC_I$ shown by a dotted line in FIG. 3 are calculated by the first estimating section 14. The first estimate values $SOC_I$ shown by a solid line in FIG. 3 are corrected values obtained by the correcting section 16.

[Math. 9]

At first, by the high-load power running of the time period t1, a high electric power (Current value I×Time period t1) is supplied from the secondary battery 2 to the battery load 3. Hence, the second estimate value $SOC_{OCV}$ decreases at a gradient according to the current value I. In the same manner, the first estimate value $SOC_I$ (first estimate value without correction) which is calculated by the first estimating section 14 decreases at a gradient according to the current value I. In order to bring the first estimate value $SOC_I$ close to the second estimate value $SOC_{OCV}$ as mentioned above (in order to gradually reduce the difference ΔSOC therebetween), the correcting operation for retarding or slowing the capacity reduction of the first estimate value $SOC_I$ calculated by the first estimating section 14 during discharging is carried out as shown by the solid line of FIG. 3.

[Math. 10]

Specifically, when the first estimate value $SOC_I$ calculated by the first estimating section 14 decreases by an amount Δi per unit time, the first estimate value $SOC_I$ corrected by the correcting section 16 decreases by an amount Δi×k per unit time. That is, the correcting section 16 corrects the first estimate value $SOC_I$ calculated by the first estimating section 14, by varying its decreasing amount. The constant k satisfies a relation of 0≤k≤1. For example, the constant k falls within a range from 0.1 to 0.3 (10~30%). Thereby, a reduction speed of the corrected first estimate value $SOC_I$ is slow (i.e., an absolute value of the gradient of the corrected first estimate value $SOC_I$ is small) as compared with the non-corrected first estimate value $SOC_I$. Hence, the corrected first estimate value $SOC_I$ approaches the second estimate value $SOC_{OCV}$ to gradually improve the estimate accuracy. Since the corrected first estimate value $SOC_I$ takes a decreasing behavior in the same manner as the second estimate value $SOC_{OCV}$, the driver does not have the strangeness feeling even if the selecting section 17 selects the first estimate value $SOC_I$ so that the remaining-capacity meter indicates the remaining capacity according to the first estimate value $SOC_I$.

Figure 6A:
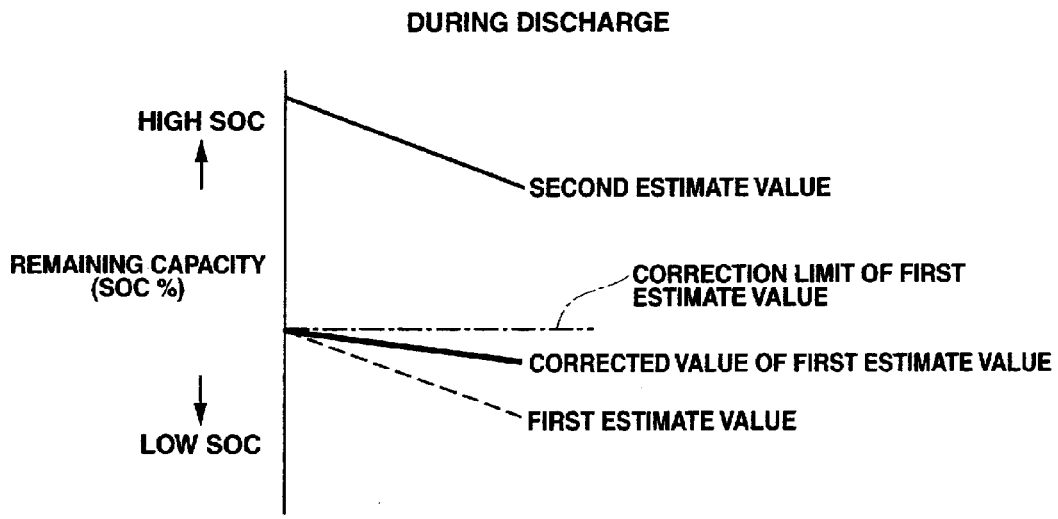
FIG. 6A is a time chart explaining a part (at the time of discharging) of control operation of the capacity estimating apparatus of FIG. 1.

In the time period t1, it is preferable that the correction amount is restricted to cause the decreasing gradient of the corrected first estimate value $SOC_I$ to be lower than or equal to 0. As shown in FIG. 6A, in a case that the first estimate value $SOC_I$ is smaller than the second estimate value $SOC_{OCV}$ during discharging, the corrected first estimate value $SOC_I$ has a positive gradient to increase the remaining capacity if the correction amount of the first estimate value $SOC_I$ (i.e., a degree to which the decreasing speed of the first estimate value $SOC_I$ is slowed) is set at an excessively large value. To prevent this phenomenon, the above-mentioned constant k is set within a range which causes the decreasing gradient of the corrected first estimate value $SOC_I$ to be lower than or equal to 0. Thereby, the strangeness feeling of the driver can be prevented.

[Math. 11]

In the above example of correcting process, the value Δi×k is subtracted from the accumulated first estimate value $SOC_I$. However, according to this embodiment, the accumulated first estimate value $SOC_I$ may be multiplied by a constant k' as the correcting process for the first estimate value $SOC_I$. Since the absolute value of gradient of the accumulated first estimate value $SOC_I$ should be reduced in the time period t1, the constant k' is set to satisfy a relation of 1<k'. If the constant k' is set at an excessively large value, the (currently) corrected first estimate value $SOC_I$ becomes larger than the last-time-around (previous-around) first estimate value $SOC_I$ so that the corrected first estimate value $SOC_I$ increases with lapse of time despite the discharging state. To prevent this phenomenon, the constant k' is set at a value smaller than a value obtained by dividing the last-time-around first estimate value $SOC_I$ by the current-time-around first estimate value $SOC_I$.

[Math. 12]

Next, by the high-load regenerative running of the time period t2, a high electric power (Current value I×Time period t2) is supplied from the battery load 3 to the secondary battery 2. Hence, the second estimate value $SOC_{OCV}$ increases at a gradient according to the current value I. In the same manner, the first estimate value $SOC_I$ (first estimate value without correction) which is calculated by the first estimating section 14 increases at a gradient according to the current value I. In order to bring the first estimate value $SOC_I$ close to the second estimate value $SOC_{OCV}$ as mentioned above (in order to gradually reduce the difference ΔSOC therebetween), a correcting operation for promoting or accelerating the capacity increase of the first estimate value $SOC_I$ calculated by the first estimating section 14 during charging is carried out as shown by the solid line of FIG. 3.

[Math. 13]

Specifically, when the first estimate value $SOC_I$ calculated by the first estimating section 14 increases by an amount Δi per unit time, the first estimate value $SOC_I$ corrected by the correcting section 16 increases by an amount Δi×k per unit time. That is, the correcting section 16 corrects the first estimate value $SOC_I$ calculated by the first estimating section 14, by varying its increasing amount. The constant k satisfies a relation of 1<k. For example, the constant k falls within a range from 1.1 to 1.3 (110~130%). Thereby, an increasing speed of the corrected first estimate value $SOC_I$ becomes high (i.e., an absolute value of gradient of the corrected first estimate value $SOC_I$ is large) as compared with the non-corrected first estimate value $SOC_I$. Hence, the corrected first estimate value $SOC_I$ approaches the second estimate value $SOC_{OCV}$ to gradually improve the estimate accuracy. Since the corrected first estimate value $SOC_I$ takes an increasing behavior in the same manner as the second estimate value $SOC_{OCV}$, the driver does not have the strangeness feeling even if the selecting section 17 selects the first estimate value $SOC_I$ so that the remaining-capacity meter indicates the remaining capacity according to the first estimate value $SOC_I$.

[Math. 14]

In the above example of correcting process, the value Δi×k is added to the accumulated first estimate value $SOC_I$. However, according to this embodiment, the accumulated first estimate value $SOC_I$ may be multiplied by a constant k' as the correcting process for the first estimate value $SOC_I$. Since the absolute value of gradient of the accumulated first estimate value $SOC_I$ should be enlarged in the time period t2, the constant k' is set to satisfy a relation of 1<k'. Since it is unfavorable that the corrected first estimate value $SOC_I$ exceeds the second estimate value $SOC_{OCV}$, the constant k' is set at a value smaller than a value obtained by dividing the second estimate value $SOC_{OCV}$ by the first estimate value $SOC_I$.

[Math. 15]

Next, by the low-load power running of the time period t3, a low electric power (Current value I×Time period t3) is supplied from the secondary battery 2 to the battery load 3. Hence, the second estimate value $SOC_{OCV}$ decreases at a gradient according to the current value I. In the same manner, the first estimate value $SOC_I$ (first estimate value without correction) which is calculated by the first estimating section 14 decreases at a gradient according to the current value I. In order to bring the first estimate value $SOC_I$ close to the second estimate value $SOC_{OCV}$ as mentioned above (in order to gradually reduce the difference ΔSOC therebetween), a correcting operation for retarding or slowing the capacity reduction of the first estimate value $SOC_I$ calculated by the first estimating section 14 during discharging is carried out as shown by the solid line of FIG. 3. In the correcting operation of the time period t3, the capacity reduction based on the discharging is more slowed as compared with the correcting operation of the time period t1.

[Math. 16]

Specifically, when the first estimate value $SOC_I$ calculated by the first estimating section 14 decreases by an amount Δi per unit time, the first estimate value $SOC_I$ corrected by the correcting section 16 decreases by an amount Δi×k per unit time. That is, the correcting section 16 corrects the first estimate value $SOC_I$ calculated by the first estimating section 14, by varying its decreasing amount. When the constant k for the time period t3 is denoted by k(t3) and the constant k for the time period t1 is denoted by k(t1), a relation of k(t3)>k(t1) is satisfied. For example, the constant k(t3) falls within a range from 0.8 to 1.0 (80~100%).

Thereby, the reduction speed of the corrected first estimate value $SOC_I$ is slow (i.e., an absolute value of gradient of the corrected first estimate value $SOC_I$ is small) as compared with the non-corrected first estimate value $SOC_I$.

Hence, the corrected first estimate value $SOC_I$ approaches the second estimate value $SOC_{OCV}$ to gradually improve the estimate accuracy. Moreover, since the corrected first estimate value $SOC_I$ takes the decreasing behavior in the same manner as the second estimate value $SOC_{OCV}$, the driver does not have the strangeness feeling even if the selecting section 17 selects the first estimate value $SOC_I$ so that the remaining-capacity meter indicates the remaining capacity according to the first estimate value $SOC_I$. Since the current value is relatively small in the time period t3, an accumulating speed of the error of current accumulation by the current sensor 11 is relatively high. However, since the first estimate value $SOC_I$ is corrected by the above-mentioned correcting operation for the time period t3, the corrected first estimate value $SOC_I$ approaches the second estimate value $SOC_{OCV}$, i.e., approaches the true value of the remaining capacity.

I[Math. 17]

In the time period t3, it is preferable that the correction amount is restricted to cause the decreasing gradient of the corrected first estimate value $SOC_I$ to be lower than or equal to 0 in the same manner as the time period t1 (see FIG. 6A). Moreover, in the above example of correcting process, the value Δi×k is subtracted from the accumulated first estimate value $SOC_I$. However, according to this embodiment, the accumulated first estimate value $SOC_I$ may be multiplied by a constant k' as the correcting process for the first estimate value $SOC_I$. Since the absolute value of gradient of the accumulated first estimate value $SOC_I$ should be reduced in the time period t3, the constant k' is set to satisfy a relation of 1<k'. If the constant k' is set at an excessively large value, the (currently) corrected first estimate value $SOC_I$ becomes larger than the last-time-around first estimate value $SOC_I$ so that the first estimate value $SOC_I$ increases with lapse of time despite the discharging state. To prevent this phenomenon, the constant k' is set at a value smaller than a value obtained by dividing the last-time-around first estimate value $SOC_I$ by the current-time-around first estimate value $SOC_I$. Moreover, when the constant k' for the time period t3 is denoted by k'(t3) and the constant k' for the time period t1 is denoted by k'(t1), a relation of k'(t3)<k'(t1) is satisfied.

[Math. 18]

Next, by the low-load regenerative running of the time period t4, a low electric power (Current value I×Time period t4) is supplied from the battery load 3 to the secondary battery 2. Hence, the second estimate value $SOC_{OCV}$ increases at a gradient according to the current value I. In the same manner, the first estimate value $SOC_I$ (first estimate value without correction) which is calculated by the first estimating section 14 increases at a gradient according to the current value I. In order to bring the first estimate value $SOC_I$ close to the second estimate value $SOC_{OCV}$ as mentioned above (in order to gradually reduce the difference ΔSOC therebetween), a correcting operation for promoting or accelerating the capacity increase of the first estimate value $SOC_I$ calculated by the first estimating section 14 during charging is carried out as shown by the solid line of FIG. 3. In the correcting operation of the time period t4, the capacity increase based on the charging is more accelerated as compared with the correcting operation of the time period t2.

[Math. 19]

Specifically, when the first estimate value $SOC_I$ calculated by the first estimating section 14 increases by an amount Δi per unit time, the first estimate value $SOC_I$ corrected by the correcting section 16 increases by an amount Δi×k per unit time. That is, the correcting section 16 corrects the first estimate value $SOC_I$ calculated by the first estimating section 14, by varying its increasing amount. When the constant k for the time period t4 is denoted by k(t4) and the constant k for the time period t2 is denoted by k(t2), a relation of k(t4)>k(t2) is satisfied. For example, the constant k(t4) falls within a range from 1.8 to 2.0 (180~200%). Thereby, an increasing speed of the corrected first estimate value $SOC_I$ is high (i.e., an absolute value of gradient of the corrected first estimate value $SOC_I$ is large) as compared with the non-corrected first estimate value $SOC_I$.

Hence, the corrected first estimate value $SOC_I$ approaches the second estimate value $SOC_{OCV}$ to gradually improve the estimate accuracy. Since the corrected first estimate value $SOC_I$ takes an increasing behavior in the same manner as the second estimate value $SOC_{OCV}$, the driver does not have the strangeness feeling even if the selecting section 17 selects the first estimate value $SOC_I$ so that the remaining-capacity meter indicates the remaining capacity according to the first estimate value $SOC_I$. Since the current value is relatively small in the time period t4, the accumulating speed of the error of the current accumulation by the current sensor 11 is relatively high. However, since the first estimate value $SOC_I$ is corrected by the above-mentioned correcting operation for the time period t4, the corrected first estimate value $SOC_I$ approaches the second estimate value $SOC_{OCV}$, i.e., approaches the true value of the remaining capacity.

[Math. 20]

In the above example of correcting process, the value Δi×k is added to the accumulated first estimate value $SOC_I$. However, according to this embodiment, the accumulated first estimate value $SOC_I$ may be multiplied by a constant k' as the correcting process for the first estimate value $SOC_I$. Since the absolute value of gradient of the accumulated first estimate value $SOC_I$ should be enlarged in the time period t4, the constant k' is set to satisfy a relation of 1<k'. Since it is unfavorable that the corrected first estimate value $SOC_I$ exceeds the second estimate value $SOC_{OCV}$, the constant k' is set at a value smaller than a value obtained by dividing the second estimate value $SOC_{OCV}$ by the first estimate value $SOC_I$. Moreover, when the constant k' for the time period t4 is denoted by k'(t4) and the constant k' for the time period t2 is denoted by k'(t2), a relation of k'(t2)<k'(t4) is satisfied.

[Math. 21]

Next, by the very-low-load power running of the time period t5, a very-low electric power (Current value I×Time period t5) is supplied from the secondary battery 2 to the battery load 3. Hence, the second estimate value $SOC_{OCV}$ decreases at a gradient according to the current value I. In the same manner, the first estimate value $SOC_I$ (first estimate value without correction) which is calculated by the first estimating section 14 decreases at a gradient according to the current value I.

[Math. 22]

In the case that the absolute value of the current value is smaller than the predetermined threshold value Ib, there is a possibility that the detection error of the current sensor 11 is large so that the judgment between the charging state and the discharging state is difficult. Therefore, in order to bring the first estimate value $SOC_I$ close to the second estimate value $SOC_{OCV}$ (in order to gradually reduce the difference ΔSOC therebetween) in the time period t5, the predetermined fixed value Z is added to the first estimate value $SOC_I$ calculated by the first estimating section 14, in cycles of predetermined duration. Thereby, the corrected first estimate value $SOC_I$ approaches the second estimate value $SOC_{OCV}$ at a constant speed to gradually improve the estimate accuracy. In this time period t5, the corrected first estimate value $SOC_I$ might increase with time lapse although during the discharging state.

A relation between the first estimate value $SOC_I$ and the second estimate value $SOC_{OCV}$ shown in FIG. 3 is in the case that the first estimate value $SOC_I$ is smaller than the second estimate value $SOC_{OCV}$ at the time of execution start of the correcting process according to this embodiment. On the other hand, a case that the first estimate value $SOC_I$ is larger than the second estimate value $SOC_{OCV}$ at the time of execution start of the correcting process according to this embodiment will now be explained referring to FIG. 5. Since object and contents of the correcting process are similar as the case of FIG. 3, parts having different structures from the case of FIG. 3 regarding the positive/negative sign of correction amount or concrete numeral values of constants and the like will now be schematically explained.

[Math. 23]

At first, by the high-load power running of the time period t1, a high electric power (Current value I×Time period t1) is supplied from the secondary battery 2 to the battery load 3. Hence, the second estimate value $SOC_{OCV}$ decreases at a gradient according to the current value I. In the same manner, the first estimate value $SOC_I$ (first estimate value without correction) which is calculated by the first estimating section 14 decreases at a gradient according to the current value I. In order to bring the first estimate value $SOC_I$ close to the second estimate value $SOC_{OCV}$ as mentioned above (in order to gradually reduce the difference ΔSOC therebetween), the correcting operation for promoting or accelerating the capacity reduction of the first estimate value $SOC_I$ calculated by the first estimating section 14 during discharging is carried out as shown by the solid line of FIG. 5.

[Math. 24]

Specifically, when the first estimate value $SOC_I$ calculated by the first estimating section 14 decreases by an amount Δi per unit time, the first estimate value $SOC_I$ corrected by the correcting section 16 decreases by an amount Δi×k per unit time. That is, the correcting section 16 corrects the first estimate value $SOC_I$ calculated by the first estimating section 14, by varying its decreasing amount. The constant k satisfies a relation of 1<k. For example, the constant k falls within a range from 1.1 to 1.3 (110~130%). Thereby, a reduction speed of the corrected first estimate value $SOC_I$ is high (i.e., an absolute value of the gradient of the corrected first estimate value $SOC_I$ is large) as compared with the non-corrected first estimate value $SOC_I$. Hence, the corrected first estimate value $SOC_I$ approaches the second estimate value $SOC_{OCV}$ to gradually improve the estimate accuracy. Since the corrected first estimate value $SOC_I$ takes a decreasing behavior in the same manner as the second estimate value $SOC_{OCV}$, the driver does not have the strangeness feeling even if the selecting section 17 selects the first estimate value $SOC_I$ so that the remaining-capacity meter indicates the remaining capacity according to the first estimate value $SOC_I$.

[Math. 25]

In the above example of correcting process, the value $\Delta i \times k$ is subtracted from the accumulated first estimate value $SOC_I$. However, according to this embodiment, the accumulated first estimate value $SOC_I$ may be multiplied by a constant k' as the correcting process for the first estimate value $SOC_I$. Since the absolute value of gradient of the accumulated first estimate value $SOC_I$ should be enlarged in the time period t1, the constant k' is set to satisfy a relation of k'<1. Since it is unfavorable that the corrected first estimate value $SOC_I$ becomes lower than the second estimate value $SOC_{OCV}$, the constant k' is set at a value larger than a value obtained by dividing the second estimate value $SOC_{OCV}$ by the first estimate value $SOC_I$.

[Math. 26]

Next, by the high-load regenerative running of the time period t2, a high electric power (Current value I×Time period t2) is supplied from the battery load 3 to the secondary battery 2. Hence, the second estimate value $SOC_{OCV}$ increases at a gradient according to the current value I. In the same manner, the first estimate value $SOC_I$ (first estimate value without correction) which is calculated by the first estimating section 14 increases at a gradient according to the current value I. In order to bring the first estimate value $SOC_I$ close to the second estimate value $SOC_{OCV}$ as mentioned above (in order to gradually reduce the difference $\Delta SOC$ therebetween), a correcting operation for retarding or slowing the capacity increase of the first estimate value $SOC_I$ calculated by the first estimating section 14 during charging is carried out as shown by the solid line of FIG. 5.

[Math. 27]

Specifically, when the first estimate value $SOC_I$ calculated by the first estimating section 14 increases by an amount $\Delta i$ per unit time, the first estimate value $SOC_I$ corrected by the correcting section 16 increases by an amount $\Delta i \times k$ per unit time. That is, the correcting section 16 corrects the first estimate value $SOC_I$ calculated by the first estimating section 14, by varying its increasing amount. The constant k satisfies a relation of 0<k<1. For example, the constant k falls within a range from 0.1 to 0.3 (10~30%). Thereby, an increasing speed of the corrected first estimate value $SOC_I$ is slow (i.e., an absolute value of gradient of the corrected first estimate value $SOC_I$ is small) as compared with the non-corrected first estimate value $SOC_I$. Hence, the corrected first estimate value $SOC_I$ approaches the second estimate value $SOC_{OCV}$ to gradually improve the estimate accuracy. Since the corrected first estimate value $SOC_I$ takes the increasing behavior in the same manner as the second estimate value $SOC_{OCV}$, the driver does not have the strangeness feeling even if the selecting section 17 selects the first estimate value $SOC_I$ so that the remaining-capacity meter indicates the remaining capacity according to the first estimate value $SOC_I$.

[Math. 28]

Figure 6B:
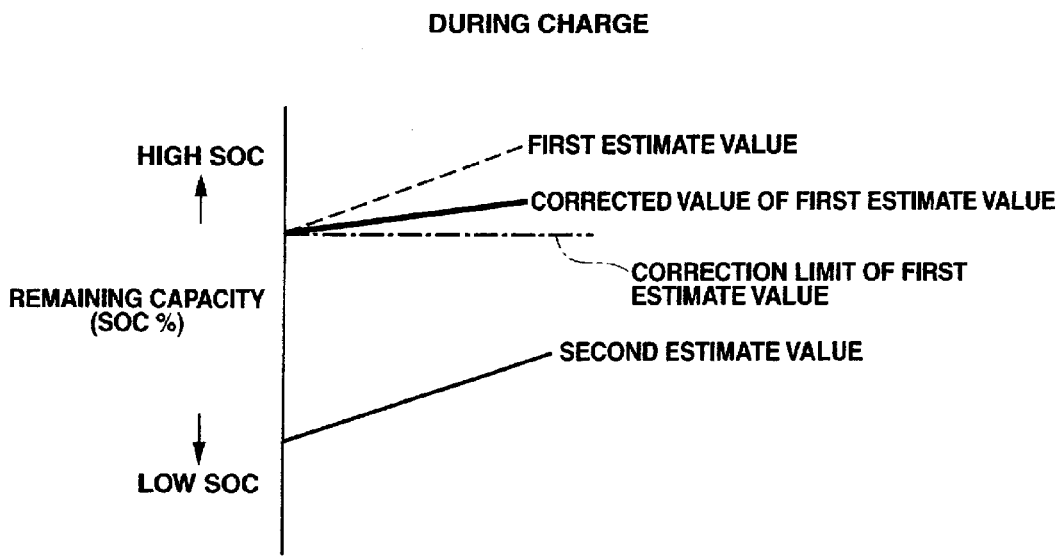
FIG. 6B is a time chart explaining a part (at the time of charging) of control operation of the capacity estimating apparatus of FIG. 1.

In the time period t2, it is preferable that the correction amount is restricted so as to cause the increasing gradient of the corrected first estimate value $SOC_I$ to be larger than or equal to 0 as shown in FIG. 6B. Moreover, in the above example of correcting process, the value $\Delta i \times k$ is added to the accumulated first estimate value $SOC_I$. However, according to this embodiment, the accumulated first estimate value $SOC_I$ may be multiplied by a constant k' as the correcting process for the first estimate value $SOC_I$. Since the absolute value of gradient of the accumulated first estimate value $SOC_I$ should be reduced in the time period t2, the constant k' is set to satisfy a relation of k'<1. If the constant k' is set at an excessively small value, the (currently) corrected first estimate value $SOC_I$ becomes smaller than the last-time-around first estimate value $SOC_I$ so that the corrected first estimate value $SOC_I$ decreases with lapse of time although during the charging state. To prevent this phenomenon, the constant k' is set at a value larger than a value obtained by dividing the last-time-around first estimate value $SOC_I$ by the current-time-around first estimate value $SOC_I$.

[Math. 29]

Next, by the low-load power running of the time period t3, a low electric power (Current value I×Time period t3) is supplied from the secondary battery 2 to the battery load 3. Hence, the second estimate value $SOC_{OCV}$ decreases at a gradient according to the current value I. In the same manner, the first estimate value $SOC_I$ (first estimate value without correction) which is calculated by the first estimating section 14 decreases at a gradient according to the current value I. In order to bring the first estimate value $SOC_I$ close to the second estimate value $SOC_{OCV}$ as mentioned above (in order to gradually reduce the difference $\Delta SOC$ therebetween), a correcting operation for promoting or accelerating the capacity reduction of the first estimate value $SOC_I$ calculated by the first estimating section 14 during discharging is carried out as shown by the solid line of FIG. 5. In the correcting process of the time period t3, the capacity reduction based on the discharging is more accelerated as compared with the correcting process of the time period t1.

[Math. 30]

Specifically, when the first estimate value $SOC_I$ calculated by the first estimating section 14 decreases by an amount $\Delta i$ per unit time, the first estimate value $SOC_I$ corrected by the correcting section 16 decreases by an amount $\Delta i \times k$ per unit time. That is, the correcting section 16 corrects the first estimate value $SOC_I$ calculated by the first estimating section 14, by varying its decreasing amount. When the constant k for the time period t3 is denoted by k(t3) and the constant k for the time period t1 is denoted by k(t1), relations of 1<k(t3) and k(t3)>k(t1) are satisfied. For example, the constant k(t3) falls within a range from 1.8 to 2.0 (180~200%). Thereby, the reduction speed of the corrected first estimate value $SOC_I$ is high (i.e., an absolute value of gradient of the corrected first estimate value $SOC_I$ is large) as compared with the non-corrected first estimate value $SOC_I$. Hence, the corrected first estimate value $SOC_I$ approaches the second estimate value $SOC_{OCV}$ to gradually improve the estimate accuracy. Moreover, since the corrected first estimate value $SOC_I$ takes the decreasing behavior in the same manner as the second estimate value $SOC_{OCV}$, the driver does not have the strangeness feeling even if the selecting section 17 selects the first estimate value $SOC_I$ so that the remaining-capacity meter indicates the remaining capacity according to the first estimate value $SOC_I$. Since the current value is relatively small in the time period t3, the accumulating speed of the error of current accumulation by the current sensor 11 is relatively high. However, since the first estimate value $SOC_I$ is corrected by the above-mentioned correcting process of the time period t3, the corrected first estimate value $SOC_I$ approaches the second estimate value $SOC_{OCV}$, i.e., approaches the true value of the remaining capacity.

[Math. 31]

In the above example of correcting process, the value $\Delta i \times k$ is subtracted from the accumulated first estimate value $SOC_I$. However, according to this embodiment, the accumulated first estimate value $SOC_I$ may be multiplied by a constant k' as the correcting process for the first estimate value $SOC_I$. Since the absolute value of gradient of the accumulated first estimate value $SOC_I$ should be enlarged in the time period t3, the constant k' is set to satisfy a relation of k'<1. Since it is unfavorable that the corrected first estimate value $SOC_I$ becomes lower than the second estimate value $SOC_{OCV}$, the constant k' is set at a value larger than a value obtained by dividing the second estimate value $SOC_{OCV}$ by the first estimate value $SOC_I$. Moreover, when the constant k' for the time period t3 is denoted by k'(t3) and the constant k' for the time period t1 is denoted by k'(t1), a relation of k'(t1)<k'(t3) is satisfied.

[Math. 32]

Next, by the low-load regenerative running of the time period t4, a low electric power (Current value I×Time period t4) is supplied from the battery load 3 to the secondary battery 2. Hence, the second estimate value $SOC_{OCV}$ increases at a gradient according to the current value I. In the same manner, the first estimate value $SOC_I$ (first estimate value without correction) which is calculated by the first estimating section 14 increases at a gradient according to the current value I. In order to bring the first estimate value $SOC_I$ close to the second estimate value $SOC_{OCV}$ as mentioned above (in order to gradually reduce the difference $\Delta SOC$ therebetween), a correcting operation for retarding or slowing the capacity increase of the first estimate value $SOC_I$ calculated by the first estimating section 14 during charging is carried out as shown by the solid line of FIG. 5. In the correcting process of the time period t4, the capacity increase based on the charging is more slowed as compared with the correcting process of the time period t2.

[Math. 33]

Specifically, when the first estimate value $SOC_I$ calculated by the first estimating section 14 increases by an amount $\Delta i$ per unit time, the first estimate value $SOC_I$ corrected by the correcting section 16 increases by an amount $\Delta i \times k$ per unit time. That is, the correcting section 16 corrects the first estimate value $SOC_I$ calculated by the first estimating section 14, by varying its increasing amount. When the constant k for the time period t4 is denoted by k(t4) and the constant k for the time period t2 is denoted by k(t2), relations of 0<k(t4)<1 and k(t4)>k(t2) are satisfied. For example, the constant k(t4) falls within a range from 0.8 to 1.0 (80~100%).

Thereby, the increasing speed of the corrected first estimate value $SOC_I$ is slow (i.e., an absolute value of gradient of the corrected first estimate value $SOC_I$ is small) as compared with the non-corrected first estimate value $SOC_I$. Hence, the corrected first estimate value $SOC_I$ approaches the second estimate value $SOC_{OCV}$ to gradually improve the estimate accuracy. Since the corrected first estimate value $SOC_I$ takes the increasing behavior in the same manner as the second estimate value $SOC_{OCV}$, the driver does not have the strangeness feeling even if the selecting section 17 selects the first estimate value $SOC_I$ so that the remaining-capacity meter indicates the remaining capacity according to the first estimate value $SOC_I$. Since the current value is relatively small in the time period t4, the accumulating speed of the error of current accumulation by the current sensor 11 is relatively high. However, since the first estimate value $SOC_I$ is corrected by the above-mentioned correcting operation for the time period t4, the corrected first estimate value $SOC_I$ approaches the second estimate value $SOC_{OCV}$, i.e., approaches the true value of the remaining capacity.

I[Math. 34]

In the above example of correcting process, the value $\Delta i \times k$ is added to the accumulated first estimate value $SOC_I$. However, according to this embodiment, the accumulated first estimate value $SOC_I$ may be multiplied by a constant k' as the correcting process for the first estimate value $SOC_I$. Since the absolute value of gradient of the accumulated first estimate value $SOC_I$ should be reduced in the time period t4, the constant k' is set to satisfy a relation of k'<1. If the constant k' is set at an excessively small value, the (currently) corrected first estimate value $SOC_I$ becomes smaller than the last-time-around first estimate value $SOC_I$ so that the first estimate value $SOC_I$ decreases with lapse of time although during the charging state. To prevent this phenomenon, the constant k' is set at a value larger than a value obtained by dividing the last-time-around first estimate value $SOC_I$ by the current-time-around first estimate value $SOC_I$. Moreover, when the constant k' for the time period t4 is denoted by k'(t4) and the constant k' for the time period t2 is denoted by k'(t2), a relation of k'(t4)<k'(t2) is satisfied.

[Math. 35]

Next, by the very-low-load power running of the time period t5, a very-low electric power (Current value I×Time period t5) is supplied from the secondary battery 2 to the battery load 3. Hence, the second estimate value $SOC_{OCV}$ decreases at a gradient according to the current value I. In the same manner, the first estimate value $SOC_I$ (first estimate value without correction) which is calculated by the first estimating section 14 decreases at a gradient according to the current value I.

[Math. 36]

In the case that the absolute value of the current value is smaller than the predetermined threshold value Ib, there is a possibility that the detection error of the current sensor 11 is large so that the judgment between the charging state and the discharging state is difficult. Therefore, in order to bring the first estimate value $SOC_I$ close to the second estimate value $SOC_{OCV}$ (in order to gradually reduce the difference $\Delta SOC$ therebetween) in the time period t5, the predetermined fixed value is subtracted from the first estimate value $SOC_I$ calculated by the first estimating section 14, in cycles of predetermined duration. Thereby, the corrected first estimate value $SOC_I$ approaches the second estimate value $SOC_{OCV}$ at a constant speed to gradually improve the estimate accuracy.

As explained above, according to the capacity estimating apparatus 1 in this embodiment, in order to bring the first estimate value obtained by the current-accumulation method to the second estimate value obtained by the open-circuit voltage method, the first estimate value is corrected to a relatively small degree when the detection error of current value is relatively small, and on the other hand, the first estimate value is corrected to a relatively great degree when the detection error of current value is relatively large. Thereby, the first estimate value is increased during charging and is reduced during discharging. Accordingly, as an advantageous effect, the strangeness feeling of the driver against the behavior of the estimate value can be relieved or lightened.

Moreover, according to the capacity estimating apparatus 1 in this embodiment, the first estimate value is corrected to a relatively small degree when the detection error of current value is relatively small, and on the other hand, the first estimate value is corrected to a relatively great degree when the detection error of current value is relatively large, as mentioned above. Therefore, the first estimate value can be brought close to the second estimate value more quickly, without the strangeness feeling.

It is noted that the current sensor 11 corresponds a current-detecting section (or means) according to the present invention, the voltage sensor 12 corresponds to a voltage-detecting section (or means) according to the present invention, the first estimating section 14 corresponds to a first estimating section (or means) according to the present invention, the second estimating section 15 corresponds to a second estimating section (or means) according to the present invention, and the correcting section 16 corresponds to a correcting section (or means) according to the present invention.

What is claimed is:

1. A capacity estimating apparatus for a secondary battery, comprising:
    a current-detecting section configured to detect a value of current flowing in the secondary battery;
    a voltage-detecting section configured to detect a voltage value of the secondary battery;
    a first estimating section configured to calculate a first estimate value of a remaining capacity of the secondary battery on the basis of an accumulated value of the current values detected by the current-detecting section; and
    a second estimating section configured to calculate a second estimate value of the remaining capacity of the secondary battery on the basis of the voltage value detected by the voltage-detecting section,
    wherein the first estimating section is configured
        to calculate a difference between the first estimate value and the second estimate value, and
        to correct the first estimate value by correcting the accumulated value so as to gradually reduce the difference,
    wherein the first estimating section is configured to correct the first estimate value by multiplying the accumulated value by a first constant larger than 0 and smaller than 1, when the first estimate value is lower than the second estimate value during a discharging state of the secondary battery or when the first estimate value is higher than the second estimate value during a charging state of the secondary battery,
    wherein the first estimating section is configured to correct the first estimate value by multiplying the accumulated value by a second constant larger than 1, when the first estimate value is lower than the second estimate value during the charging state of the secondary battery or when the first estimate value is higher than the second estimate value during the discharging state of the secondary battery.

2. The capacity estimating apparatus as claimed in claim 1, wherein
    the first constant and the second constant are set according to a magnitude of the current value detected by the current-detecting section.

3. The capacity estimating apparatus as claimed in claim 1, wherein
    the first estimating section is configured to maintain the first estimate value without correcting the first estimate value when an absolute value of the difference between the first estimate value and the second estimate value is lower than a predetermined difference value.

4. The capacity estimating apparatus as claimed in claim 1, wherein
    the first estimating section is configured to correct the first estimate value by correcting the accumulated value so as to gradually reduce the difference and configured to output the corrected first estimate value, in a case that a charging or discharging of the secondary battery is permitted within a predetermined time interval from when both of the charging and the discharging of the secondary battery were prohibited.

5. The capacity estimating apparatus as claimed in claim 4, wherein
    the second estimating section is configured to calculate the second estimate value on the basis of the voltage value detected by the voltage-detecting section and the first estimating section is configured to correct the first estimate value to become equal to the second estimate value, in a case that the charging or discharging of the secondary battery is permitted after a lapse of the predetermined time interval from when both of the charging and the discharging of the secondary battery were prohibited.

6. The capacity estimating apparatus as claimed in claim 1, wherein
    the first estimating section is configured to calculate a difference between a previously-stored data of the first estimate value and a current-time data of the second estimate value, for the correction of the first estimate value.

7. The capacity estimating apparatus as claimed in claim 1, further comprising
    an external equipment configured to indicate the corrected first estimate value.

8. A capacity estimating apparatus for a secondary battery, comprising:
    a current-detecting section configured to detect a value of current flowing in the secondary battery;
    a voltage-detecting section configured to detect a voltage value of the secondary battery;
    a first estimating section configured to calculate a first estimate value of a remaining capacity of the secondary battery on the basis of an accumulated value of the current values detected by the current-detecting section; and
    a second estimating section configured to calculate a second estimate value of the remaining capacity of the secondary battery on the basis of the voltage value detected by the voltage-detecting section,
    wherein the first estimating section is configured
        to calculate a difference between the first estimate value and the second estimate value, and
        to correct the first estimate value by correcting the accumulated value so as to gradually reduce the difference, wherein the first estimating section is configured to set a correction amount of the first estimate value to be larger as an absolute value of the current value becomes smaller and to set the correction amount of the first estimate value to be smaller as the absolute value of the current value becomes larger, when compared under a state where the absolute value of the current value is larger than or equal to a predetermined value and under an identical charging or discharging state of the secondary battery and under an identical magnitude relation between the first estimate value and the second estimate value.

9. The capacity estimating apparatus as claimed in claim 8, wherein
the first estimating section is configured to set the correction amount of the first estimate value at a predetermined fixed amount when the absolute value of the current value is smaller than the predetermined value.

10. The capacity estimating apparatus as claimed in claim 8, wherein
the first estimating section is configured to bring a percentage of the correction amount with respect to the first estimating section closer to 100% as the absolute value of the current value becomes smaller when the absolute value of the current value is larger than or equal to the predetermined value.

11. A capacity estimating apparatus for a secondary battery, comprising:
a current-detecting section configured to detect a value of current flowing in the secondary battery;
a voltage-detecting section configured to detect a voltage value of the secondary battery;
a first estimating section configured to calculate a first estimate value of a remaining capacity of the secondary battery on the basis of an accumulated value of the current values detected by the current-detecting section; and
a second estimating section configured to calculate a second estimate value of the remaining capacity of the secondary battery on the basis of the voltage value detected by the voltage-detecting section,
wherein the first estimating section is configured
to calculate a difference between the first estimate value and the second estimate value, and
to correct the first estimate value by correcting the accumulated value so as to gradually reduce the difference,
wherein the first estimating section is configured to restrict the correction of the first estimate value so as not to increase the first estimate value, when the first estimate value is lower than the second estimate value during the discharging state of the secondary battery,
wherein the first estimating section is configured to restrict the correction of the first estimate value so as not to decrease the first estimate value, when the first estimate value is higher than the second estimate value during the charging state of the secondary battery.

12. A capacity estimating apparatus for a secondary battery, comprising:
a current-detecting section configured to detect a value of current flowing in the secondary battery;
a voltage-detecting section configured to detect a voltage value of the secondary battery;
a first estimating section configured to calculate a first estimate value of a remaining capacity of the secondary battery on the basis of an accumulated value of the current values detected by the current-detecting section;
a second estimating section configured to calculate a second estimate value of the remaining capacity of the secondary battery on the basis of the voltage value detected by the voltage-detecting section; and
a correcting section configured
to calculate a difference between the first estimate value and the second estimate value, and
to correct the first estimate value to gradually reduce the difference,
wherein the correcting section is configured to correct the first estimate value by multiplying the first estimate value by a third constant when the first estimate value is lower than the second estimate value during a discharging state of the secondary battery, the third constant being larger than 1 and smaller than a value obtained by dividing a previously-corrected first estimate value by the first estimate value currently calculated based on the previously-corrected first estimate value,
wherein the correcting section is configured to correct the first estimate value by multiplying the first estimate value by a fourth constant when the first estimate value is lower than the second estimate value during a charging state of the secondary battery, the fourth constant being larger than 1 and smaller than a value obtained by dividing the second estimate value by the first estimate value,
wherein the correcting section is configured to correct the first estimate value by multiplying the first estimate value by a fifth constant when the first estimate value is higher than the second estimate value during the discharging state of the secondary battery, the fifth constant being smaller than 1 and larger than a value obtained by dividing the second estimate value by the first estimate value,
wherein the correcting section is configured to correct the first estimate value by multiplying the first estimate value by a sixth constant when the first estimate value is higher than the second estimate value during the charging state of the secondary battery, the sixth constant being smaller than 1 and larger than a value obtained by dividing a previously-corrected first estimate value by the first estimate value currently calculated based on the previously-corrected first estimate value.

13. The capacity estimating apparatus as claimed in claim 12, wherein
the third to sixth constants are set according to a magnitude of the current value detected by the current-detecting section.

14. The capacity estimating apparatus as claimed in claim 12, wherein
the correcting section is configured to correct the first estimate value to gradually reduce the difference and configured to output the corrected first estimate value, in a case that a charging or discharging of the secondary battery is permitted within a predetermined time interval from when both of the charging and the discharging of the secondary battery were prohibited.

15. The capacity estimating apparatus as claimed in claim 14, wherein
the second estimating section is configured to calculate the second estimate value on the basis of the voltage value detected by the voltage-detecting section and the correcting section is configured to correct the first estimate value to become equal to the second estimate value, in a case that the charging or discharging of the secondary battery is permitted after a lapse of the predetermined time interval from when both of the charging and the discharging of the secondary battery were prohibited.

16. The capacity estimating apparatus as claimed in claim 12, wherein the correcting section is configured to calculate a difference between a previously-stored data of the first estimate value and a current-time data of the second estimate value, for the correction of the first estimate value.

17. The capacity estimating apparatus as claimed in claim 12, further comprising an external equipment configured to indicate the corrected first estimate value.

* * * * *